United States Patent
Li et al.

(10) Patent No.: US 12,256,535 B2
(45) Date of Patent: Mar. 18, 2025

(54) SEMICONDUCTOR DEVICE AND METHOD FOR FORMING SEMICONDUCTOR DEVICE

(71) Applicant: CHANGXIN MEMORY TECHNOLOGIES, INC., Hefei (CN)

(72) Inventors: Sheng Li, Hefei (CN); Xing Jin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 574 days.

(21) Appl. No.: 17/520,786

(22) Filed: Nov. 8, 2021

(65) Prior Publication Data

US 2022/0367477 A1 Nov. 17, 2022

Related U.S. Application Data

(63) Continuation of application No. PCT/CN2021/113623, filed on Aug. 19, 2021.

(30) Foreign Application Priority Data

May 13, 2021 (CN) .......................... 202110524592.7

(51) Int. Cl.
 *H10B 12/00* (2023.01)
 *H01L 21/3213* (2006.01)
 *H01L 21/768* (2006.01)

(52) U.S. Cl.
 CPC ..... *H10B 12/482* (2023.02); *H01L 21/32139* (2013.01); *H01L 21/76811* (2013.01); *H01L 21/7682* (2013.01); *H01L 21/76877* (2013.01)

(58) Field of Classification Search
 CPC ............ H10B 12/482; H01L 21/32139; H01L 21/76811; H01L 21/7682; H01L 21/76877
 See application file for complete search history.

(56) References Cited

U.S. PATENT DOCUMENTS

| | | | |
|---|---|---|---|
| 7,396,775 B2 * | 7/2008 | Lee | ........................ H10B 99/00 257/E21.705 |
| 7,888,798 B2 | 2/2011 | Hong | |
| 10,276,633 B1 | 4/2019 | Hung et al. | |

(Continued)

FOREIGN PATENT DOCUMENTS

| | | | |
|---|---|---|---|
| CN | 101393904 A | 3/2009 | |
| CN | 106783743 A | 5/2017 | |
| CN | 108777253 A * | 11/2018 | ........... H01L 21/764 |

*Primary Examiner* — Fernando L Toledo
*Assistant Examiner* — Marshall Mu-Nuo Hatfield
(74) *Attorney, Agent, or Firm* — Kilpatrick Townsend & Stockton LLP

(57) ABSTRACT

A semiconductor device and a method for forming the semiconductor device are provided. The method includes the following operations. A semiconductor substrate is provided, the semiconductor substrate includes multiple bit line structures disposed at intervals along a first direction; for each of the multiple bit line structures, surfaces of the bit line structure are filled with a conductive material to form a conductive layer covering the surfaces of the bit line structure. A top surface of the conductive layer is higher than a top surface of the bit line structure; and the conductive layer is etched to form multiple first conductive layers independent of each other and multiple second conductive layers, each of which is located on a respective one of the first conductive layers.

7 Claims, 26 Drawing Sheets

(56) References Cited

U.S. PATENT DOCUMENTS

| | | |
|---|---|---|
| 10,608,045 B2 | 3/2020 | Hung et al. |
| 10,971,498 B2 | 4/2021 | Lu et al. |
| 2006/0079093 A1* | 4/2006 | Kim .................. H01L 21/32137 |
| | | 257/E21.252 |
| 2008/0284006 A1 | 11/2008 | Hong |
| 2013/0009153 A1* | 1/2013 | Lee .................... H01L 29/41766 |
| | | 257/51 |
| 2015/0056801 A1* | 2/2015 | Park .................... H01L 21/7682 |
| | | 438/655 |
| 2018/0226410 A1* | 8/2018 | Chang .................. H10B 12/485 |
| 2019/0164976 A1* | 5/2019 | Kim ........................ H01L 28/90 |
| 2019/0273117 A1 | 9/2019 | Hung et al. |
| 2019/0305081 A1* | 10/2019 | LaJoie .................. H01L 27/124 |
| 2020/0066728 A1 | 2/2020 | Lu et al. |
| 2020/0083224 A1* | 3/2020 | Chang .................... H10B 12/05 |
| 2020/0357804 A1 | 11/2020 | Lee et al. |
| 2020/0402839 A1* | 12/2020 | Im ......................... H01L 21/763 |
| 2021/0193665 A1 | 6/2021 | Lu et al. |
| 2021/0217625 A1* | 7/2021 | Chung ................. H10B 12/482 |

* cited by examiner

SEMICONDUCTOR DEVICE AND METHOD FOR FORMING SEMICONDUCTOR DEVICE

CROSS-REFERENCE TO RELATED APPLICATION

The present application is a continuation of International Application No. PCT/CN2021/113623, filed on Aug. 19, 2021, which is based upon and claims priority to Chinese patent application No. 202110524592.7, filed on May 13, 2021 and entitled "Semiconductor Device and Method for Forming Semiconductor Device". The contents of International Application No. PCT/CN2021/113623 and Chinese patent application No. 202110524592.7 are hereby incorporated by reference in their entireties.

BACKGROUND

A Dynamic Random Access Memory (DRAM) is a commonly used semiconductor storage device in computers, and is composed of many repetitive storage units. Each storage unit may usually include a capacitor and a transistor. A source of the transistor is connected with the capacitor through a storage Node Contact (NC) and a Landing Pad (LP), so that data information stored in the capacitor may be read, or data information may be written into the capacitor for storage.

SUMMARY

In a first aspect, the embodiment of the present disclosure provides a method for forming a semiconductor device. The method may include the following operations. A semiconductor substrate may be provided, the semiconductor substrate may include multiple bit line structures disposed at intervals along a first direction; for each of the multiple bit line structures, surfaces of the bit line structure may be filled with a conductive material to form a conductive layer covering the surfaces of the bit line structure. A top surface of the conductive layer may be higher than a top surface of the bit line structure; and the conductive layer may be etched to form multiple first conductive layers independent of each other and multiple second conductive layers, each of which is located on a respective one of the first conductive layers.

In a second aspect, the embodiment of the present disclosure further provides a semiconductor device formed by the method for forming the semiconductor device. The semiconductor device may include a semiconductor substrate, bit line structures, first conductive layers and second conductive layers. Multiple active areas disposed at intervals may be formed on the semiconductor substrate. Each of the bit line structures may include a bit line contact layer, a bit line metal layer and a bit line mask layer. The bit line metal layer may intersect with an active area of the active areas through the bit line contact layer. The bit line structures may be disposed at intervals along a first direction. Each of the first conductive layers may be connected to a capacitor through a respective one of the second conductive layers. Each of the second conductive layers may include a first structure that is located on a part of a respective one of the first conductive layers and has a first preset height, and a second structure that is located on a part of a respective one of the bit line structures and has a second preset height. The first preset height may be greater than the second preset height.

BRIEF DESCRIPTION OF THE DRAWINGS

In the drawings (which are not necessarily drawn to scale), similar reference signs may describe similar components in different views. Similar reference signs with different letter suffixes may represent different examples of similar components. The drawings generally illustrate the various embodiments discussed herein by way of examples rather than limitation.

DETAILED DESCRIPTION

The specific technical solutions of the present disclosure will be further described in detail below in combination with the drawings in the embodiment of the present disclosure. The following embodiments are used to illustrate the present disclosure, but are not used to limit the scope of the present disclosure.

In the subsequent description, suffixes such as "module" or "unit" used to represent elements are used only to facilitate the description of the present disclosure, which has no specific meaning in itself. Therefore, the use of "module" and "unit" are interchangeable.

Terms used in the disclosure are only adopted for the purpose of describing specific embodiments and not intended to limit the disclosure. In the disclosure, the terms in a singular form, such as "a/an", "said" and "the", are also intended to include a plural form concept, unless other meanings are clearly indicated from the context. "A and/or B" may indicate three cases: the A exists alone, both the A and the B coexist, and the B exists alone. "Including at least one of A, B or C" may include any one or more elements selected from a set composed of the A, the B and the C.

Although terms "first", "second", "third" and the like may be adopted to describe various information in the disclosure, the information should not be limited to these terms. These terms are only adopted to distinguish the information of the same type. For example, without departing from the scope of the disclosure, first information may also be called second information and, and similarly, second information may also be called first information.

In related arts, firstly, a contact hole is defined by forming two intersecting mask patterns, and the contact hole is filled with a conductive material to form the storage NC; and secondly, the LP is formed on the storage NC by a composition process. It can be seen that the process of forming the storage NC and the LP in the related arts requires an advanced exposure technology to form a finer pattern, which is a severe challenge to high exposure rate. Moreover, in the related arts, the forming process of the storage NC and the LP includes many operations, the process is relatively complex, and a manufacturing cost of a semiconductor device is relatively high.

Figure 1:
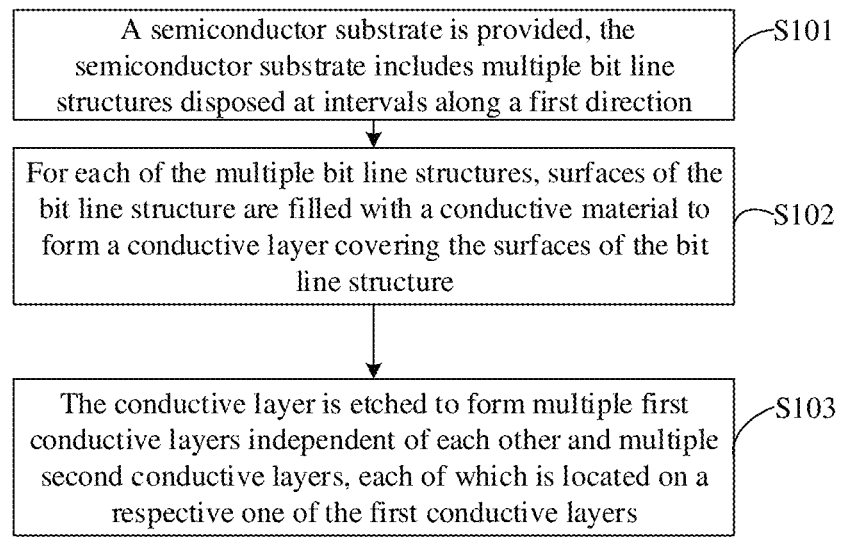
FIG. 1 is an optional schematic flowchart diagram of a method for forming a semiconductor device provided in an embodiment of the present disclosure.

The embodiment of the present disclosure provides a method for forming a semiconductor device. FIG. 1 is an optional schematic flowchart diagram of a method for forming a semiconductor device provided in an embodiment of the present disclosure. As illustrated in FIG. 1, the method may include the following operations.

At an operation S101, a semiconductor substrate is provided, the semiconductor substrate includes multiple bit line structures disposed at intervals along a first direction.

Herein, a material of the semiconductor substrate may be any one of silicon (Si), silicon germanium alloy (SiGe), silicon carbide (SiC), aluminum oxide ($Al_2O_3$), aluminum nitride (AlN), zinc oxide (ZnO), gallium oxide ($Ga_2O_3$), lithium aluminate ($LiAlO_2$), etc. Because an Si substrate is cheap, easy to be doped and easy to react to form a heterogeneous isolation layer, Si is selected as the substrate in the embodiment of the present disclosure.

The semiconductor substrate may include a top surface on a front side and a bottom surface on a back side opposite to the front side. In a case of ignoring the flatness of the top surface and the bottom surface, a direction perpendicular to the top surface and the bottom surface of the substrate is defined as a third direction. In the direction of the top surface and the bottom surface of the substrate (i.e., the plane where the substrate is located), a first direction and a second direction that intersect with each other (e.g., the first direction and the second direction are perpendicular to each other) are defined. For example, an arrangement direction of multiple bit line structures may be defined as the first direction, and the plane direction of the semiconductor substrate may be determined based on the first direction and the second direction. Herein, the first direction, the second direction and the third direction are perpendicular to each other. In the embodiment of the present disclosure, the first direction is defined as an X-axis direction, the second direction is defined as a Y-axis direction, and the third direction is defined as a Z-axis direction.

In some embodiments, each of the multiple bit line structures may include a bit line contact layer, a bit line metal layer and a bit line mask layer sequentially formed on the semiconductor substrate. In the embodiment of the present disclosure, the semiconductor substrate may include at least one bit line structure.

At an operation S102, for each of the multiple bit line structures, surfaces of the bit line structure are filled with a conductive material to form a conductive layer covering the surfaces of the bit line structure.

A top surface of the conductive layer is higher than a top surface of the bit line structure.

Herein, the conductive material may be any metal material or semiconductor material, and the conductive material may also be a mixed material of multiple metal materials, a mixed material of multiple semiconductor materials, or a mixed material of the metal materials and the semiconductor materials. In the embodiment of the present disclosure, the conductive material may include a first conductive material and a second conductive material, and the conductive layer may include a first initial conductive layer and a second initial conductive layer.

At an operation S103, the conductive layer is etched to form multiple first conductive layers independent of each other and multiple second conductive layers, each of which is located on a respective one of the first conductive layers.

In the embodiment of the present disclosure, the semiconductor device may be a DRAM, the first conductive layer may be a storage NC, and the second conductive layer may be an LP.

According to the method for forming the semiconductor device provided in the embodiment of the present disclosure, by directly etching a conductive layer, multiple first conductive layers independent of each other and multiple second conductive layers, each of which is located on a respective one of the first conductive layers are formed, so as to form a semiconductor device. In such a way, a manufacturing process of the semiconductor device may be greatly simplified, and a manufacturing cost of the semiconductor device may be reduced.

FIGS. 2A-2E are schematic flowcharts of forming a conductive layer provided in an embodiment of the present disclosure. FIGS. 3A-3K and FIGS. 4A-4G are schematic flowcharts of forming a first conductive layer and a second conductive layer provided in an embodiment of the present disclosure. Next, please referring to schematic structural diagrams in a forming process of a semiconductor device in FIGS. 2A-2E, FIGS. 3A-3K and FIGS. 4A-4G, the method for forming the semiconductor device provided in the embodiment of the present disclosure is further described in detail.

Figure 2A:
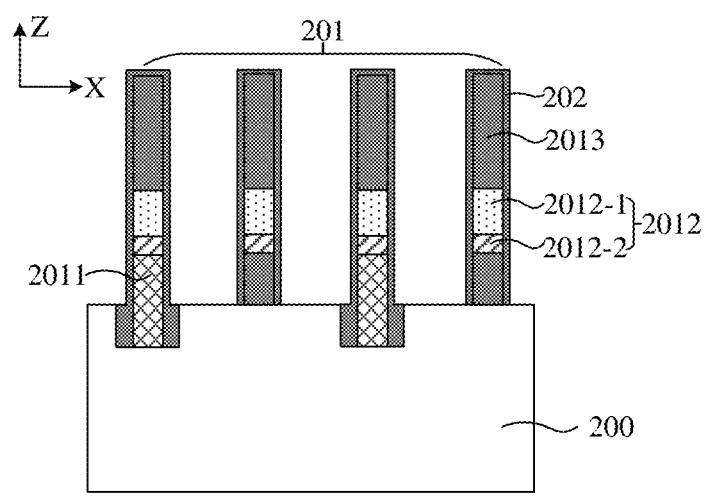
FIGS. 2A-2E are schematic flowcharts of forming a conductive layer provided in an embodiment of the present disclosure.

Firstly, referring to FIG. 2A, an operation S101 is performed to provide a semiconductor substrate, herein the semiconductor substrate includes multiple bit line structures disposed at intervals along the first direction.

FIG. 2A is a schematic sectional structure diagram of a semiconductor substrate including multiple bit line structures provided in the embodiment of the present disclosure. As illustrated in FIG. 2A, the semiconductor substrate 200 may include four bit line structures 201 disposed along an X-axis direction, and each of the bit line structures 201 may include a bit line contact layer 2011, a bit line metal layer 2012 and a bit line mask layer 2013 that are sequentially stacked along an Z-axis direction. The bit line mask layer 2013 is used as an etching mask to form the bit line metal layer 2012. A material of the bit line metal layer may include tungsten (W), cobalt (Co), copper (Cu), aluminum (Al), polysilicon, doped silicon, silicide or any combination thereof. In the embodiment of the present disclosure, a material of the bit line contact layer 2011 may be polysilicon, and the bit line metal layer 2012 may include a metal tungsten layer 2012-1 and a titanium-containing metal layer 2012-2. For example, the titanium-containing metal layer may be a composite layer of a titanium nitride layer and a metal titanium layer.

It is to be noted that, FIG. 2A only exemplarily illustrates a limited number of bit line structures. In the actual manufacturing process, the semiconductor substrate may include multiple bit line structures.

Next, a positional relationship between the bit line structure and the semiconductor substrate is described as follows. Please continuing to refer to FIG. 2A, the semiconductor substrate 200 includes multiple active areas disposed at intervals (not illustrated in the FIG. 2A), the bit line contact layer 2011 intersects with an active area of the active areas in the semiconductor substrate, and the bit line metal layer 2012 is formed on the bit line contact layer 2011. In such a way, an electrical connection between the bit line metal layer and the active area may be realized.

Next, the forming process of the bit line contact layer and the bit line metal layer in the bit line structure is described as follows.

In some embodiments, each of the active areas may at least include a bit line contact area forming a bit line contact layer. The bit line contact layer and the bit line metal layer are formed by the following manners.

At an operation S10, a first dielectric layer is formed on a surface of the semiconductor substrate, and the first dielectric layer is configured to protect the active areas in the semiconductor substrate.

Herein, the first dielectric layer may be a silicon oxide layer.

At an operation S11, the first dielectric layer and each of the active areas are etched to form a bit line contact hole in each bit line contact area.

At an operation S12, the bit line contact hole is filled with a bit line contact material to form an initial bit line contact layer.

At an operation S13, a metal layer and a bit line mask layer are sequentially deposited and formed on the surface of the first dielectric layer.

At an operation S14, the metal layer and the initial bit line contact layer are etched through the bit line mask layer to form the bit line contact layer and the bit line metal layer.

In some embodiments, continuing to refer to FIG. 2A, the semiconductor substrate 200 may further include a second dielectric layer 202 located on surfaces of each of the bit line structures 201, and the second dielectric layer 202 is configured to isolate the bit line structure from another structure subsequently formed around the bit line structure, such as a storage NC and an LP. Herein, a material of the second dielectric layer may include any one of the following materials: silicon nitride, silicon oxide and silicon oxynitride.

Next, referring to FIGS. 2B-2E, an operation S102 is performed to fill the surfaces of the bit line structure with a conductive material, so as to form a conductive layer covering the surfaces of the bit line structure.

In some embodiments, the operation S102 may include the following operations.

At an operation S1021, for each of the multiple bit line structures 201, the surfaces of the bit line structure are filled with a first conductive material, to form a first initial conductive layer covering the surfaces of the bit line structure.

Figure 2B:
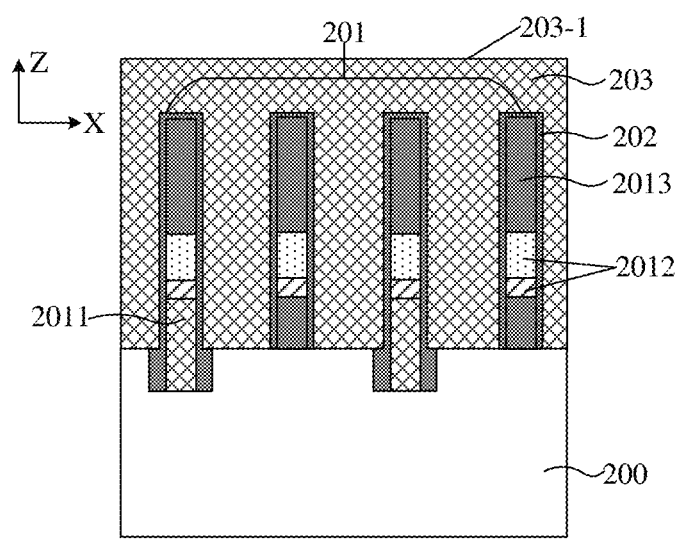

As illustrated in FIG. 2B, for each of the multiple bit line structures 201, the surfaces of the bit line structure 201 are filled with a first conductive material, so as to form a first initial conductive layer 203 covering the surfaces of the bit line structure 201 and the surfaces of the second dielectric layer 202. Herein, the first conductive material may be polysilicon, and a top surface 203-1 of the first initial conductive layer 203 is higher than a top surface of the bit line structure 201.

At an operation S1022, the first initial conductive layer is etched back to expose a part of the bit line mask layer of the bit line structure.

Figure 2C:
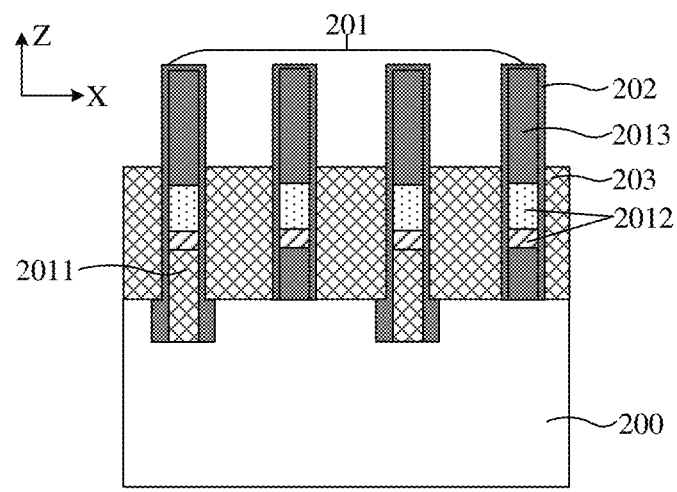

As illustrated in FIG. 2C, an etching back treatment is performed on the first initial conductive layer 203 by adopting a dry etching process to reduce the height of the first initial conductive layer 203 in the Z-axis direction and to expose a part of the bit line mask layer 2013 of the bit line structure 201.

Herein, the dry etching process may adopt plasma etching technologies, reactive ion etching technologies or ion milling technologies.

At an operation S1023, a top surface of the first initial conductive layer after being etched back is filled with a second conductive material, to form the second initial conductive layer covering surfaces of the part of the bit line mask layer.

A top surface of the second initial conductive layer is higher than a top surface of the bit line mask layer.

Figure 2D:
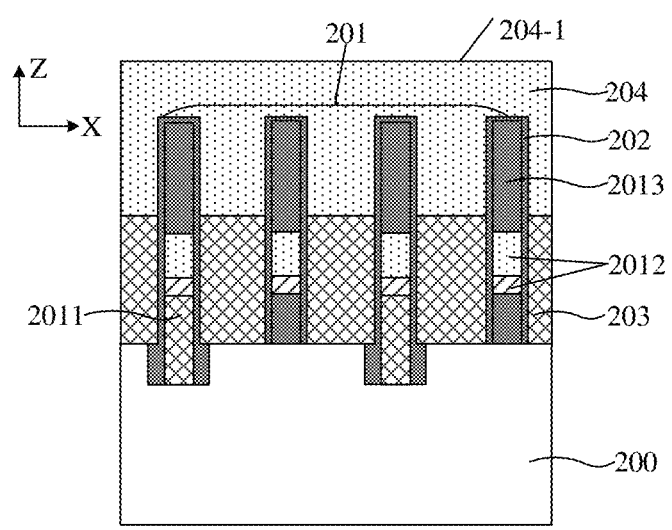

As illustrated in FIG. 2D, surfaces of the first initial conductive layer 203 are filled with a second conductive material, to form a second initial conductive layer 204 covering surfaces of a part of the bit line mask layer 2013. Herein, the second conductive material may be the metal W, and a top surface 204-1 of the second initial conductive layer 204 is higher than a top surface of the bit line mask layer 2013.

In some embodiments, after forming the second initial conductive layer, the method for forming the semiconductor device may further include the following operations.

At an operation S1024, a Chemical Mechanical Polishing (CMP) treatment or a back etching treatment is performed on the second initial conductive layer.

In the embodiment of the present disclosure, the purpose of performing the CMP treatment or the back etching treatment on the second initial conductive layer is to make the second initial conductive layer have a flat surface, so as to facilitate the subsequent growth of other structures or films on the second initial conductive layer.

Figure 2E:
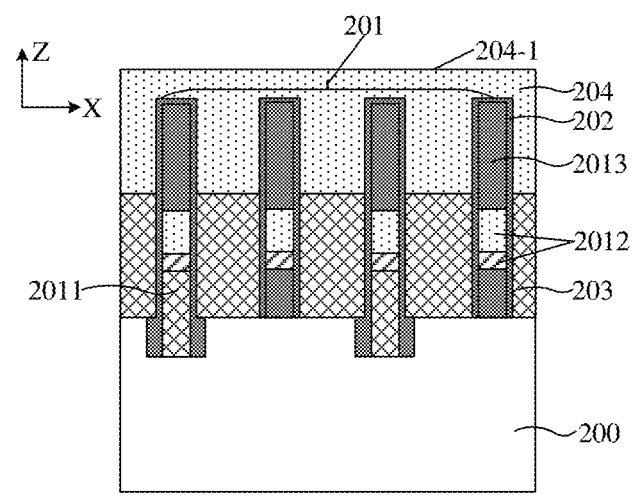

As illustrated in FIG. 2E, after the Chemical Mechanical Polishing (CMP) treatment or the back etching treatment is performed on the second initial conductive layer 204, the top surface 204-1 of the second initial conductive layer 204 is still higher the top surface of the bit line mask layer 2013, and there is a preset height difference between the top surface 204-1 of the second initial conductive layer 204 and the top surface of the bit line mask layer 2013. In some embodiments, the preset height difference may be 10-80 nm.

Next, referring to FIGS. 3A-3K and FIGS. 4A-4G, the operation S103 is performed to etch the conductive layer, so as to form multiple first conductive layers independent of each other and multiple second conductive layers, each of which is located on a respective one of the first conductive layers.

In some embodiments, the operation S103 may include the following operations.

At an operation S1031, a first etching treatment is performed on the first initial conductive layer and the second initial conductive layer are sequentially along the third direction, to form first etching conductive layers independent of each other along the second direction and second etching conductive layers independent of each other along the second direction.

At an operation S1032, a second etching treatment is performed on the second etching conductive layers along the third direction, to form multiple first conductive layers independent of each other and multiple second conductive layers, each of which is located on a respective one of the first conductive layers. Herein, the second direction is perpendicular to the first direction, a plane formed by the second direction and the first direction is parallel to a plane where the semiconductor substrate is located, and the third direction is perpendicular to the plane where the semiconductor substrate is located.

In some embodiments, a process of the first etching treatment may include the following operations.

At an operation S20, a first mask layer with a first mask pattern is formed on the top surface of the second initial conductive layer.

Herein, the first mask layer may include a first hard mask layer, a first anti-reflective layer and a first photoresist layer that are stacked in sequence. The operation S20 is includes the following operations.

At an operation S201, the first hard mask layer, the first anti-reflective layer and the first photoresist layer are formed on the top surface of the second initial conductive layer, and the first photoresist layer has a first initial mask pattern.

Herein, the first hard mask layer may be a spin coated carbon layer, and the first anti-reflective layer may be a silicon oxynitride layer. In the embodiment of the present disclosure, the first hard mask layer, the first anti-reflective layer and the first photoresist layer may be formed by any suitable deposition process, such as Chemical Vapor Deposition (CVD), Physical Vapor Deposition (PVD) and Atomic Layer Deposition (ALD).

Figure 3A:
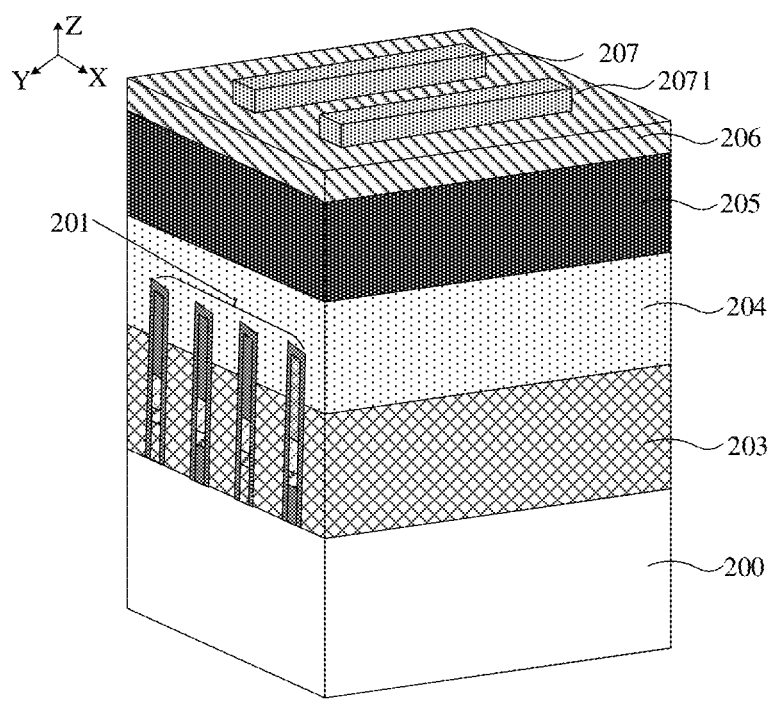
FIGS. 3A-3K and FIGS. 4A-4G are schematic flowcharts of forming a first conductive layer and a second conductive layer provided in an embodiment of the present disclosure.
Figure 3B:
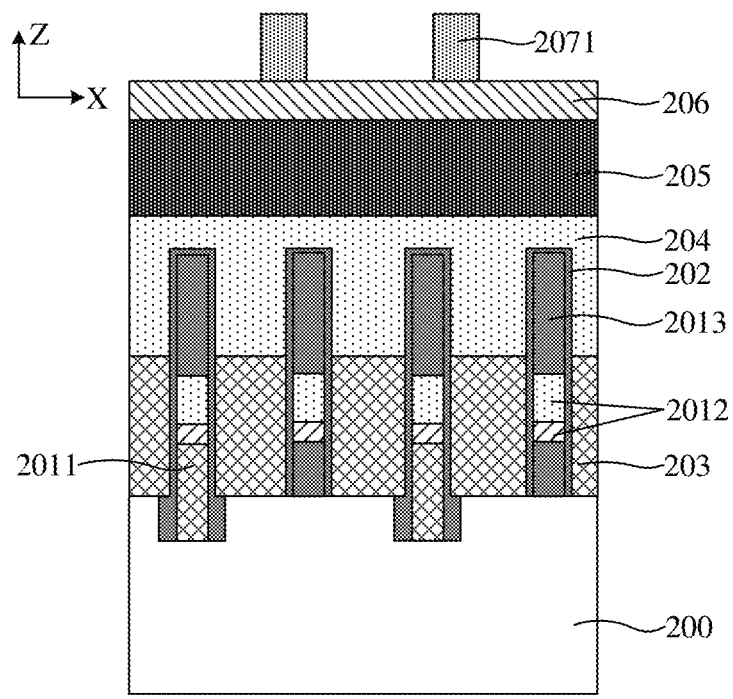

As illustrated in FIG. 3A and FIG. 3B, a first hard mask layer 205, a first anti-reflective layer 206 and a first photoresist layer 207 are sequentially formed on a top surface of a second initial conductive layer 204, so as to form a first mask layer. The first photoresist layer 207 has a first initial mask pattern, the first initial mask pattern consists of multiple strip patterns 2071 disposed in parallel along the X-axis direction.

At an operation S202, an isolation layer is formed on surfaces of the first photoresist layer having the first initial mask pattern.

Figure 3C:
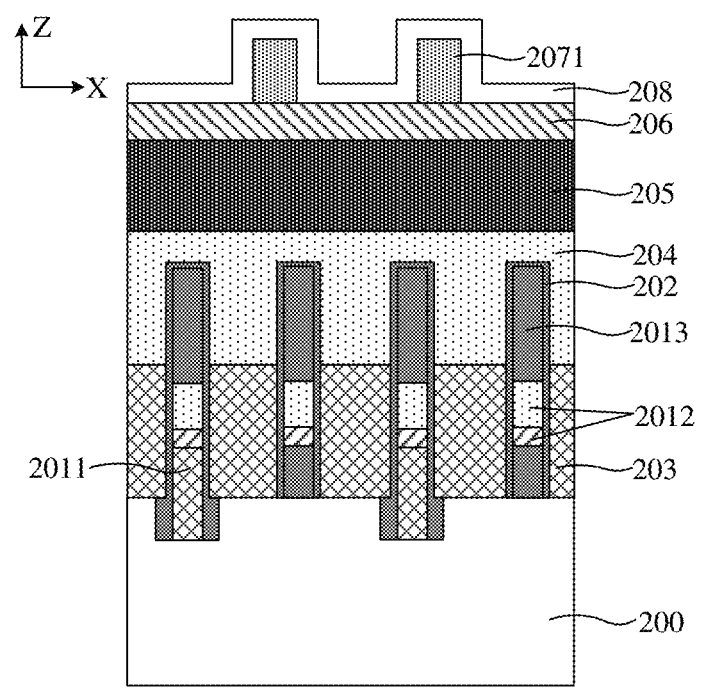

As illustrated in FIG. 3C, an isolation layer 208 is formed on surfaces of the first photoresist layer 207 having the first initial mask pattern. Herein, a material of the isolation layer may be silicon oxide.

At an operation S203, the isolation layer and the first initial mask pattern are sequentially etched with a part of the isolation layer located on side walls of the first initial mask pattern retained, so as to form an isolation side wall pattern.

Figure 3D:
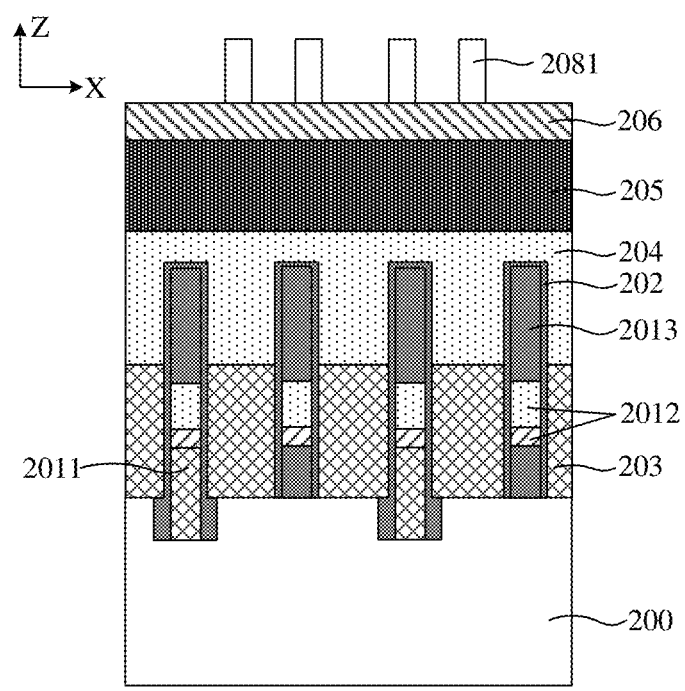

As illustrated in FIG. 3D, the isolation layer 208 and the first initial mask pattern are sequentially etched by adopting a dry etching process with a part of the isolation layer 208 located on side walls of each strip pattern 2071 in the first initial mask pattern retained, so as to form an isolation side wall pattern 2081.

At an operation S204, the first anti-reflective layer and the first hard mask layer are etched through the isolation side wall pattern, so as to form the first mask layer having the first mask pattern.

In the embodiment of the present disclosure, the isolation side wall pattern is the first mask pattern. The forming of the isolation side wall pattern means the forming of the first mask layer having the first mask pattern. The subsequent process of the first etching treatment may be performed by using the isolation side wall pattern.

At an operation S21, through the first mask layer, the second initial conductive layer and the first initial conductive layer are sequentially etched to both have the first mask pattern, so as to form the first etching conductive layers independent of each other along the second direction and the second etching conductive layers independent of each other along the second direction.

Figure 3E:
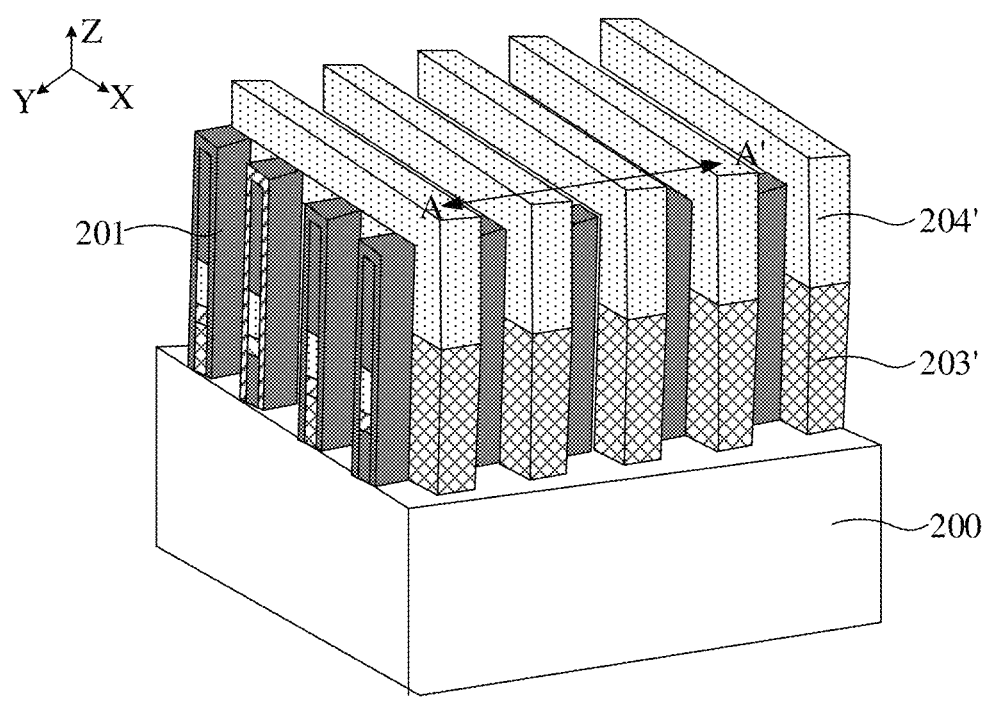
Figure 3F:
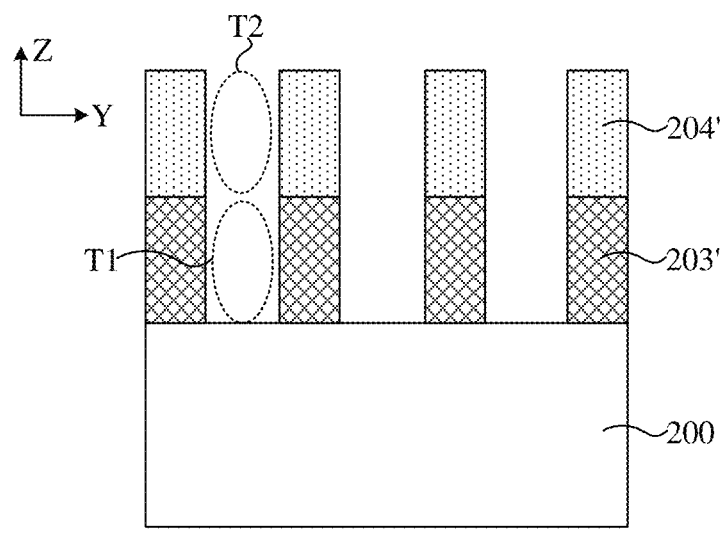
Figure 3G:
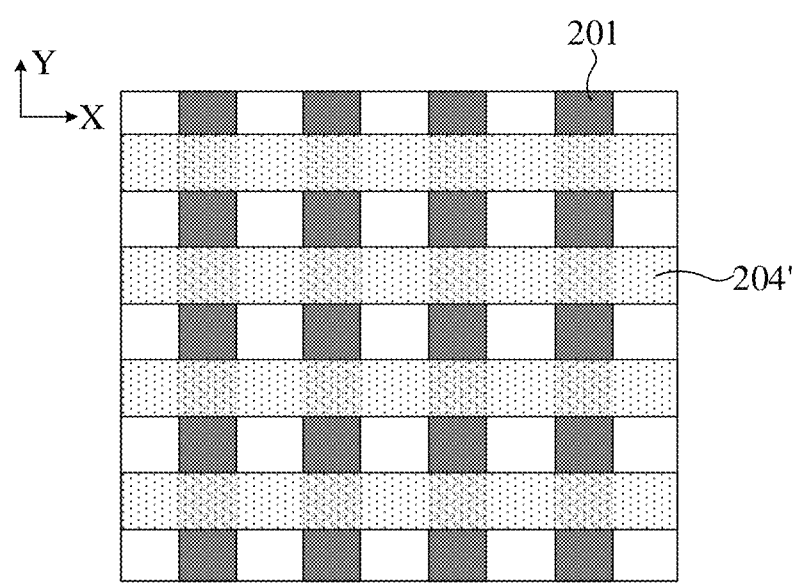

FIG. 3E is a three-dimensional structural schematic diagram of the formed first etching conductive layer and second etching conductive layer provided in the embodiment of the present disclosure. FIG. 3F is a sectional structural schematic diagram along A-A' in FIG. 3E. FIG. 3G is a top view of the formed first etching conductive layer and second etching conductive layer. In combination with FIGS. 3E-3G, after etching the second initial conductive layer 204 and the first initial conductive layer 203 through the first mask layer, first etching conductive layers 203' independent of each other in the Y-axis direction and second etching conductive layers 204' independent of each other in the Y-axis direction are formed.

In some embodiments, after forming the first etching conductive layers independent of each other along the Y-axis direction and the second etching conductive layers independent of each other along the Y-axis direction, a first etching trench is formed between every two adjacent first etching conductive layers, and a second etching trench is formed between every two adjacent second etching conductive layers. For example, continuing to refer to continuing to refer to FIG. 3F, a first etching trench T1 is formed between every two adjacent first etching conductive layers 203', and a second etching trench T2 is formed between every two adjacent second etching conductive layers 204'.

In some embodiments, after forming the first etching conductive layers independent of each other along the second direction and the second etching conductive layers independent of each other along the second direction and before performing the second etching treatment, the method for forming the semiconductor device may further include the following operations.

At an operation S30, a storage contact isolation material is filled in the first etching trench between every two adjacent first etching conductive layers and the second etching trench between every two adjacent second etching conductive layers, so as to form storage contact isolation layers.

Figure 3H:
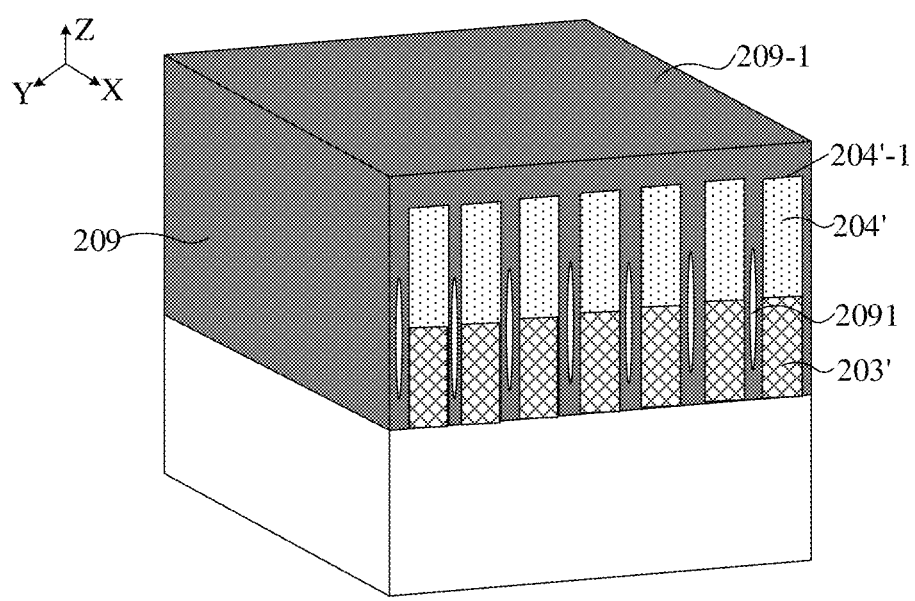
Figure 3I:
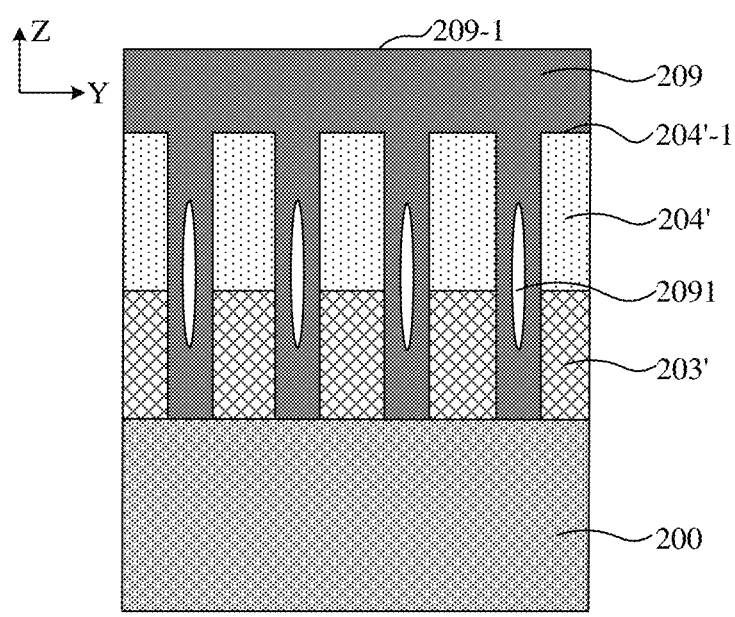

As illustrated in FIG. 3H and FIG. 3I, a storage contact isolation material is filled in the first etching trench T1 between every two adjacent first etching conductive layers 203' and the second etching trench T2 between every two adjacent second etching conductive layers 204', so as to form storage contact isolation layers 209. Herein, a top surface 209-1 of the storage contact isolation layers 209 is higher than a top surface 204'-1 of the second etching conductive layer.

Herein, the storage contact isolation material may be silicon nitride.

In the embodiment of the present disclosure, since the first etching trench T1 and the second etching trench T2 have a relatively large depth-to-width ratio (the depth-to-width ratio is greater than 10:1), a gap will be generated during the filling process of the storage contact isolation material, and the generated gap may be used as an air gap between adjacent first conductive layers. In this way, a Critical Dimension (CD) of the first etching trench may be reduced, accordingly, a dimension of the first conductive layer will increase, a resistance of the first conductive layer will decrease, and a Resistance Capacitance (RC) delay will decrease. For example, continuing to refer to FIG. 3H and FIG. 3I, when the storage contact isolation layer 209 is formed, an air gap 2091 located in the storage contact isolation layer is formed.

At an operation S31, the storage contact isolation layers are etched to remove a part, on a top surface of the second etching conductive layers, of the storage contact isolation layers.

Figure 3J:
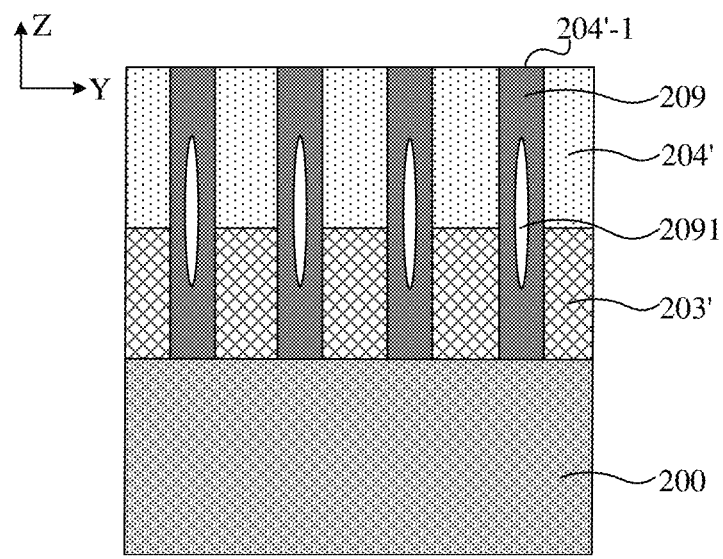
Figure 3K:
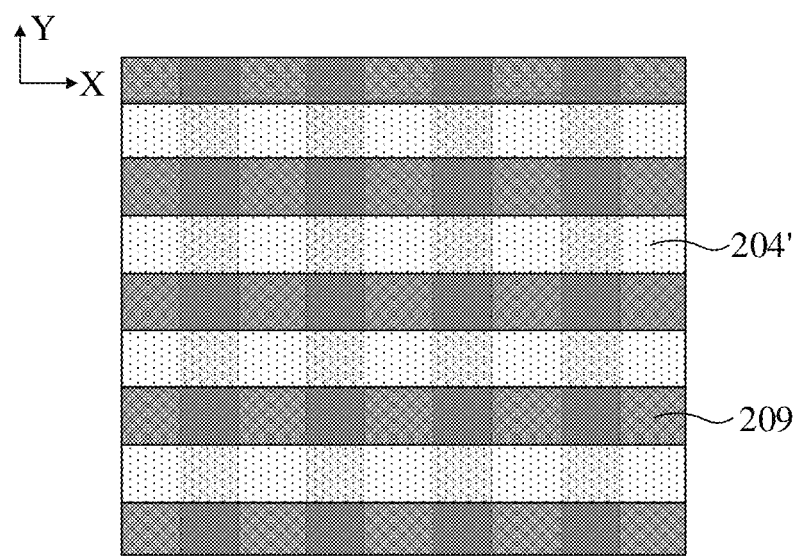

As illustrated in FIG. 3J and FIG. 3K, by adopting a dry etching process, the storage contact isolation layers 209 are etched along the Z-axis direction until the top surface 204'-1 of the second etching conductive layer is exposed.

In some embodiments, the operation that the second etching treatment is performed on the second etching conductive layers along the third direction, so as to form the multiple first conductive layers independent of each other and the multiple second conductive layers, each of which is located on a respective one of the first conductive layers may include the following operations. A partial etching treatment is performed, along the third direction, on a respective one of the second etching conductive layers on each of bit line mask layers to expose a part of the bit line mask layer, so as to form the first conductive layers independent of each other along the first direction and the second conductive layers, each of which is located on a respective one of the first conductive layers.

In some embodiments, the process of the second etching treatment may include the following operations.

At an operation S22, a second mask layer with a second mask pattern is formed on a top surface of the second etching conductive layers and a top surface of the storage contact isolation layers.

Herein, the second mask layer may include a second hard mask layer, a second anti-reflective layer and a second photoresist layer that are stacked in sequence. The operation S22 includes the following operations.

At an operation S221, the second hard mask layer, the second anti-reflective layer and the second photoresist layer are sequentially deposited and formed on the top surface of the second etching conductive layers and the top surface of the storage contact isolation layers.

Herein, the second hard mask layer is the same as the first hard mask layer, the second anti-reflective layer is the same as the first anti-reflective layer, and the second photoresist layer is the same as the first photoresist layer.

Figure 4A:
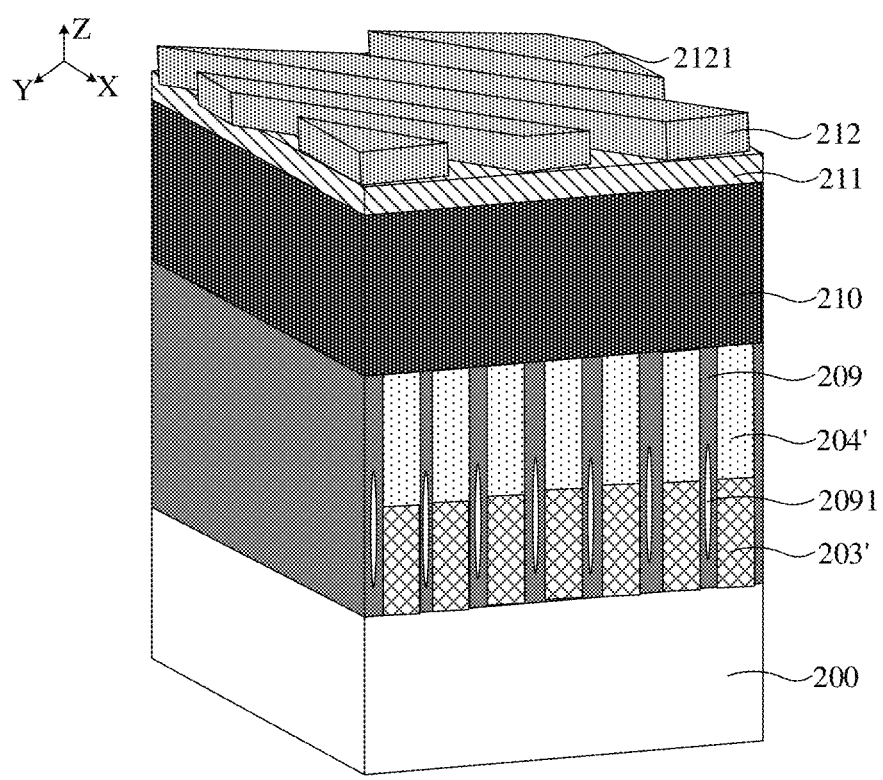
Figure 4B:
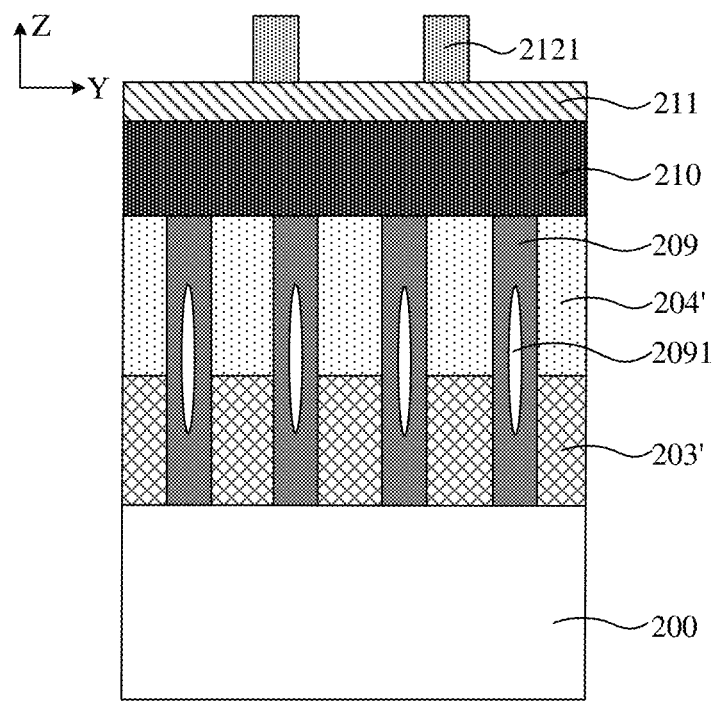
Figure 4C:
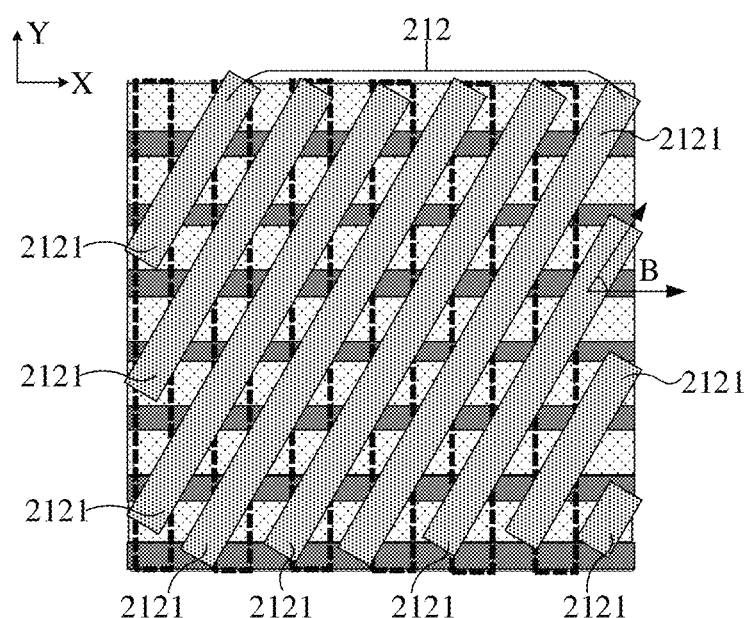
Figure 4D:
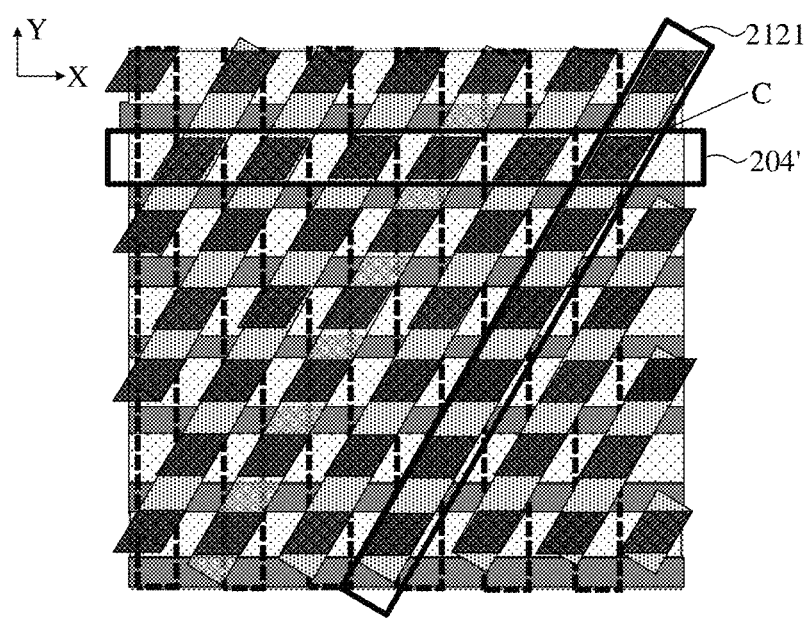

As illustrated in FIGS. 4A-4C, a second hard mask layer 210, a second anti-reflective layer 211 and a second photoresist layer 212 are sequentially deposited and formed on the top surface of the second etching conductive layers 204' and the top surface of the storage contact isolation layers 209. The second photoresist layer 212 has a second mask pattern. The second mask pattern may include multiple sub patterns 2121 disposed in parallel along the X-axis direction. An included angle B is formed between an extension direction of each sub pattern 2121 in a plane parallel to the semiconductor substrate and the first direction, and the included angle B is not equal to 90 degrees. For example, the included angle B may be 60 degrees or 120 degrees.

In the embodiment of the present disclosure, a pinched rhombic area is formed between each of the sub patterns and the second etching conductive layer, the pinched rhombic area is used to form a subsequent second conductive layer. For example, In FIG. 4D, there is a pinched rhombic area C between each of a sub patterns 2121 and a second etching conductive layer 204'.

At an operation S222, through each of the sub patterns, the second anti-reflective layer and the second hard mask layer are sequentially etched, so as to form the second mask layer with the second mask pattern.

In the embodiment of the present disclosure, the subsequent process of second etching treatment is performed by using the second mask pattern.

At an operation S23, through the second mask pattern, a part of a respective one of the second etching conductive layers located on each of bit line mask layers is removed by etching with the remaining parts of the second etching conductive layers forming the second conductive layers.

Figure 4E:
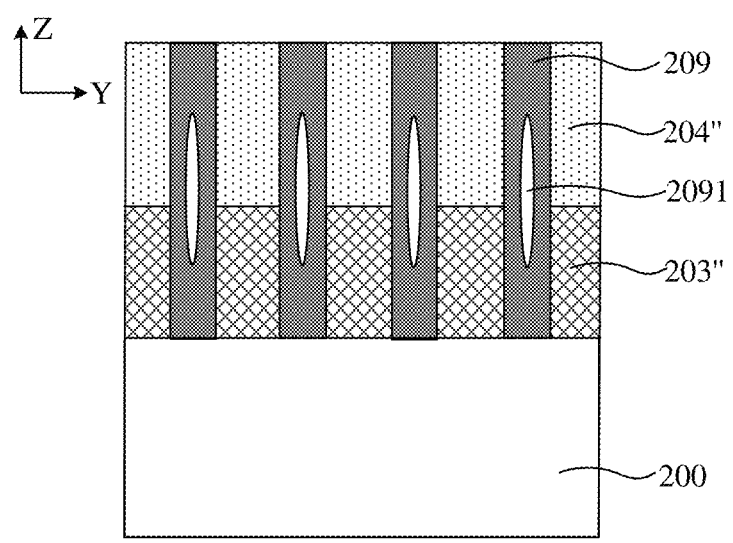
Figure 4F:
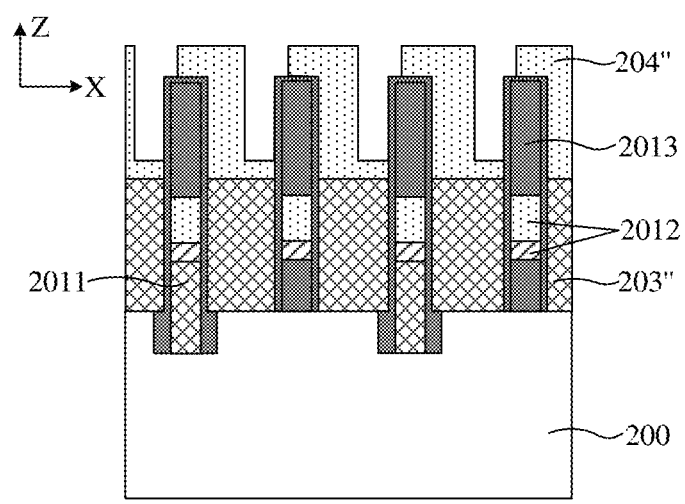
Figure 4G:
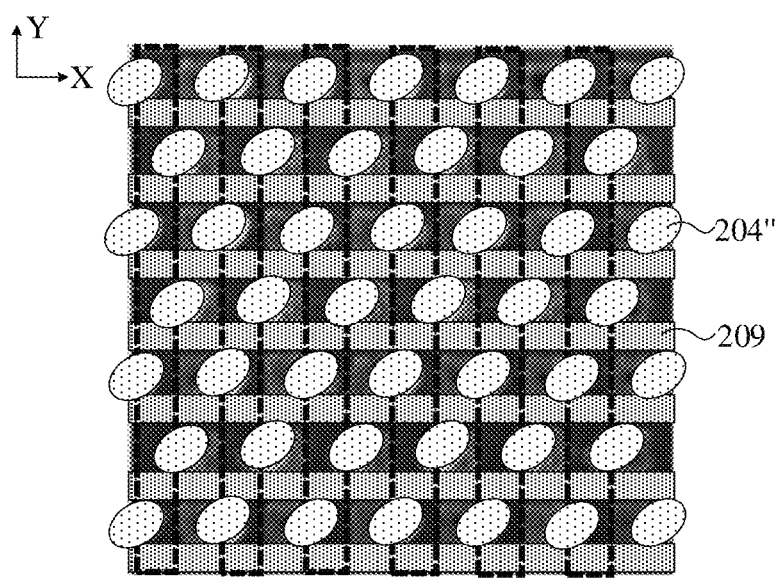

As illustrated in FIGS. 4E-4G, through a second mask pattern, a respective one of the second etching conductive layers 204' is etched, so as to form second conductive layers 204" located on a respective one of the first conductive layers 203".

In some embodiments, the method for forming the semiconductor device may further include the following operations: a capacitor is formed on a surface of the second conductive layer after forming the second conductive layer.

In some embodiments, the operation that the capacitor is formed on the surface of the second conductive layer may include the following operations.

At an operation S40, an insulating material is filled between every two adjacent second conductive layers to form an insulating layer.

At an operation S41, a first electrode layer, a dielectric layer and a second electrode layer are sequentially deposited on the surface of the second conductive layer and the surface of the insulating layer, so as to form the capacitor.

Herein, a material of the first electrode layer and the second electrode layer may include any of the following materials: metal, a doped semiconductor, a conductive metal oxide and a conductive metal nitride.

In some embodiments, the method for forming the semiconductor device may further include: a word line structure located in the active area is formed before forming the bit line structure.

A transistor is formed in the active area of the semiconductor device provided in the embodiment of the present disclosure. A gate of the transistor is connected with a word line, a drain of the transistor is connected with a bit line, and a source of the transistor is connected with the capacitor. Voltage signals on the word line may control the transistor to be turned on or turned off, so that data information stored in the capacitor may be read through the bit line, or data information may be written into the capacitor through the bit line for storage.

The embodiment of the present disclosure provides a new forming process of a semiconductor device. By directly etching the conductive layer, multiple first conductive layers independent of each other and multiple second conductive layers, each of which is located on a respective one of the first conductive layers are formed, so as to form the semiconductor device. The method is simple and ingenious, thereby greatly simplifying the process flow and production cost. Moreover, the method for forming the semiconductor device provided by the embodiment of the present disclosure does not require an advanced exposure technology. The method for forming the semiconductor device provided by the embodiment of the present disclosure can be realized by adopting simple and convenient processes and is easy for large-scale production.

Figure 5A:
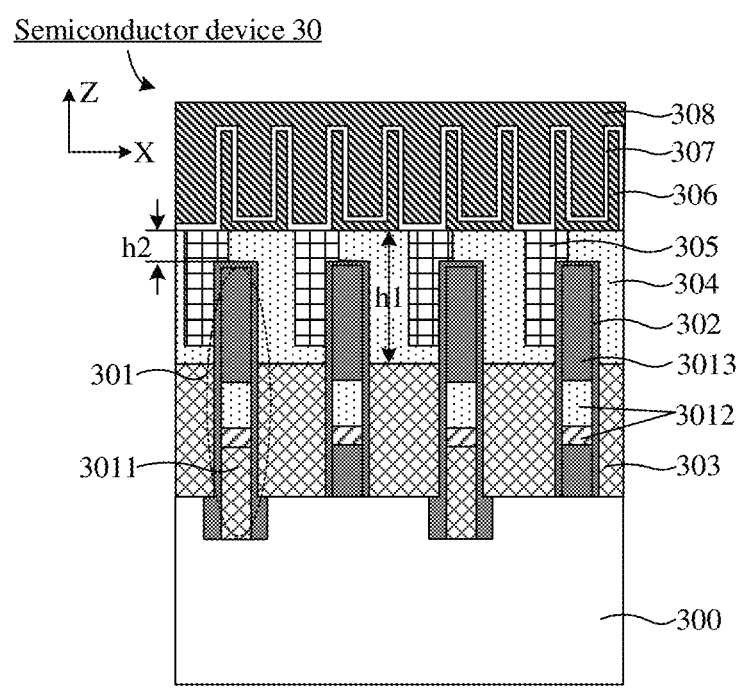
FIG. 5A and FIG. 5B are optional schematic structural diagrams of a semiconductor device provided in an embodiment of the present disclosure.
Figure 5B:
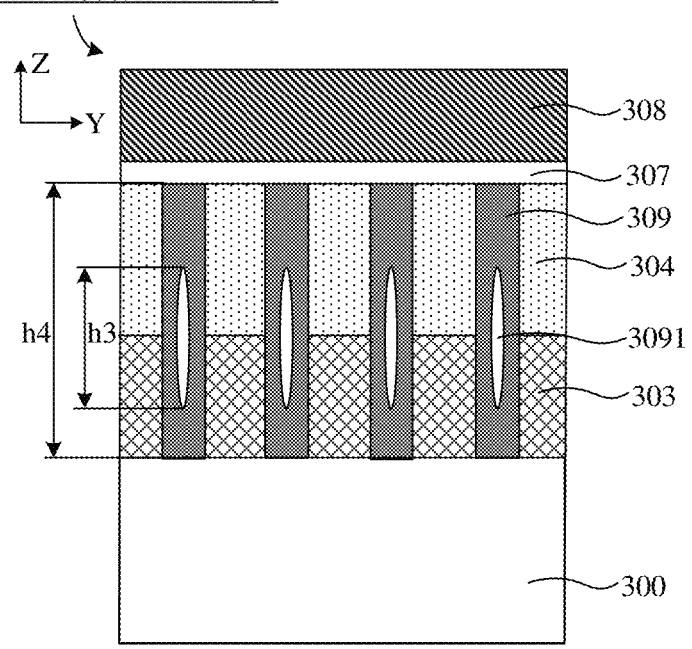

Besides, the embodiment of the present disclosure also provides a semiconductor device formed by the method for forming the semiconductor device provided by the above embodiment. FIG. 5A and FIG. 5B are optional schematic structural diagrams of a semiconductor device provided in an embodiment of the present disclosure. As illustrated in FIG. 5A and FIG. 5B, the semiconductor device 30 may include a semiconductor substrate 300, bit line structures 301, first conductive layers 303, second conductive layers 304 and capacitors.

Multiple active areas (not illustrated in the figure) disposed at intervals are formed on the semiconductor substrate 300.

Each of the bit line structures 301 may include a bit line contact layer 3011, a bit line metal layer 3012 and a bit line mask layer 3013. The bit line metal layer 3012 intersects with an active area of the active areas through the bit line contact layer 3011. The bit line structures 301 are disposed at intervals along the first direction.

Herein, the first direction may be the X-axis direction, and the bit line structures 301 are disposed at intervals along the X-axis direction.

In some embodiments, the semiconductor device 30 may further include dielectric layers 302 located on surfaces of a respective one of the bit line structures 301, and each of the dielectric layers 302 is configured to protect the respective one of the bit line structure 301.

Each of the first conductive layers 303 is connected to a capacitor through a respective one of the second conductive layers 304.

In some embodiments, each of the first conductive layer may be a storage NC, and the second conductive layer may be an LP.

Continuing to refer to FIG. 5A, each of the second conductive layers 304 may include a first structure and a second structure. The first structure is located on a part of a respective one of the first conductive layers 303 and has a first preset height h1 and the second structure is located on a part of a respective one of the bit line structures and has a second preset height h2. The first preset height h1 is greater than the second preset height h2.

Continuing to refer to FIG. 5B, in some embodiments, the semiconductor device 30 may further include storage contact isolation layers 309. Each of the storage contact isolation layers 309 is located between every two adjacent first conductive layers 303 and between every two adjacent second conductive layers 304.

In some embodiments, continuing to refer to FIG. 5B, the semiconductor device 30 may further include air gaps 3091, and the air gaps 3091 are located in a respective one of the storage contact isolation layers sequentially disposed along the second direction. The second direction is perpendicular to the first direction, and a plane formed by the second direction and the first direction is parallel to a plane where the semiconductor substrate 300 is located. Herein, the second direction is the Y-axis direction.

In some embodiments, continuing to refer to FIG. 5B, each of the air gaps 3091 is composed of a first part and a second part. The first part of the air gap 3091 is located in a part of the respective storage contact isolation layer between two adjacent first conductive layers 303. The second part of the air gap is located in a part of the respective storage contact isolation layer between two adjacent second conductive layers 304 corresponding to the two adjacent first conductive layers.

In the embodiment of the present disclosure, the first part and the second part are equal in size. In other embodiments, the sizes of the first part and the second part may not be equal.

In the embodiment of the present disclosure, a height difference between the overlap of the first part and the second part of the air gap and a metal tungsten layer in the bit line structure is less than a preset height value. In this way, the connection between adjacent first conductive layers and the connection between adjacent second conductive layers may be reduced.

In some embodiments, continuing to refer to FIG. 5B, each of the air gaps 3091 has a third preset height h3 along the third direction. Each of the storage contact isolation layers has a fourth preset height h4 along the third direction. The fourth preset height is greater than the third preset height, and a difference between the fourth preset height h4 and the third preset height h3 is less than a preset difference. The third direction is perpendicular to the plane where the semiconductor substrate is located. In the embodiment of the present disclosure, the value of the preset difference is not specifically limited.

Herein, the third direction, the first direction and the second direction are perpendicular to each other, and the third direction is the Z-axis direction.

In some embodiments, continuing to refer to FIG. 5A and FIG. 5B, the semiconductor device 30 may further include insulating layers 305, each of which is located between two adjacent second conductive layers 304. Each of the insulating layers is configured to make the second conductive layer have a flat surface, so as to facilitate a subsequent formation of a capacitor on the second conductive layer. A material of the insulating layer 305 may be silicon dioxide.

In the embodiment of the present disclosure, continuing to refer to FIG. 5A and FIG. 5B, each of the capacitors may include a first electrode layer 306, a dielectric layer 307 and a second electrode layer 308. Herein, the material of the first electrode layer 306 and the second electrode layer 308 may include any of the following materials: metal, a doped semiconductor, conductive metal oxide and conductive metal nitride. The material of the dielectric layer 307 may include any of the following materials: hafnium oxide, zirconium oxide, aluminum oxide, lanthanum trioxide, tantalum trioxide, titanium dioxide and a perovskite structure.

The method for forming the semiconductor device provided in the embodiment of the present disclosure is similar to the method for forming the semiconductor device in the above embodiment. For the technical features not disclosed in detail in the embodiment of the present disclosure, please refer to the above embodiment for understanding.

According to a semiconductor device provided in the embodiment of the present disclosure, since the semiconductor device has an air gap in each storage contact isolation layer between adjacent first conductive layers and in each storage contact isolation layer between adjacent second conductive layers. Therefore, the CD of the storage contact isolation layer between the adjacent first conductive layers may be reduced, the dimension of the first conductive layer will increase, the resistance of the first conductive layer will decrease, and the RC delay will decrease. Thus, the manufactured semiconductor device has excellent electrical performance.

In several embodiments provided in the present disclosure, it should be understood that, the disclosed devices and methods may be realized in a non-target manner. The device embodiments described above are only schematic. For example, the division of the unit is only a logical function division, and there may be another division mode in actual implementation, for example, multiple units or components may be combined or integrated into another system, or some features may be ignored or not executed.

The features disclosed in several methods or device embodiments provided by the disclosure may be combined arbitrarily without conflict to obtain new method embodiments or device embodiments.

The above descriptions are only some implementation manners of the present disclosure and not intended to limit the scope of protection of the present disclosure. Modifications or replacements that are apparent to those skilled in the art within the technical scope disclosed by the embodiment of the disclosure shall fall within the scope of protection of the present disclosure. Therefore, the scope of protection of the present disclosure should be subject to the protection scope of the claims.

The invention claimed is:

1. A method for forming a semiconductor device, comprising:
   providing a semiconductor substrate, the semiconductor substrate comprising a plurality of bit line structures disposed at intervals along a first direction;
   a surface of each of the plurality of bit line structures is filled with a conductive material to form a conductive layer, wherein a top surface of the conductive layer is higher than a top surface of each of the plurality of bit line structures; and
   etching the conductive layer to form a plurality of first conductive layers independent of each other and a plurality of second conductive layers, each of which is located on a respective one of the first conductive layers;

wherein the conductive material comprises a first conductive material and a second conductive material; the conductive layer comprises a first initial conductive layer and a second initial conductive layer;

the surface of each of the plurality of bit line structures is filled with the conductive material to form the conductive layer, comprises:

the surface of each of the plurality of bit line structures is filled with the first conductive material to form the first initial conductive layer;

etching back the first initial conductive layer to expose a portion of each of the plurality of bit line structures; and filling a surface of the first initial conductive layer after being etched back with the second conductive material to form the second initial conductive layer, wherein a top surface of the second initial conductive layer is higher than a top surface of each of the plurality of bit line structures; and, wherein each of the bit line structures comprises a bit line contact layer, a bit line metal layer and a bit line mask layer that are sequentially stacked along a third direction, the third direction is perpendicular to a plane where the semiconductor substrate is located; and etching back the first initial conductive layer to expose a portion of each of the plurality of bit line structures, comprises:

etching back the first initial conductive layer to expose the bit line mask layer;

filling the surface of the first initial conductive layer after being etched back with the second conductive material to form the second initial conductive layer, wherein the top surface of the second initial conductive layer is higher than a top surface of the bit line mask layer, wherein etching the conductive layer to form the plurality of the first conductive layers independent of each other and the plurality of the second conductive layers, each of which is located on a respective one of the plurality of first conductive layers, comprises:

sequentially performing, along the third direction, a first etching treatment on the first initial conductive layer and the second initial conductive layer, to form first etching conductive layers independent of each other along a second direction and second etching conductive layers independent of each other along the second direction; and performing, along the third direction, a second etching treatment on the second etching conductive layers, to form the plurality of first conductive layers independent of each other and the plurality of second conductive layers, each of which is located on the respective one of the first conductive layers, wherein the second direction is perpendicular to the first direction, a plane formed by the second direction and the first direction is parallel to a plane where the semiconductor substrate is located, the first etching treatment comprises:

forming a first mask layer with a first mask pattern on the top surface of the second initial conductive layer; and sequentially etching, through the first mask layer, the second initial conductive layer and the first initial conductive layer to make both the second initial conductive layer and the first initial conductive layer have the first mask pattern, so as to form the first etching conductive layers independent of each other along the second direction and the second etching conductive layers independent of each other along the second direction, wherein the first mask layer comprises a first hard mask layer, a first anti-reflective layer and a first photoresist layer that are stacked in sequence;

forming the first mask layer having the first mask pattern on the top surface of the second initial conductive layer comprises:

forming the first hard mask layer, the first anti-reflective layer and the first photoresist layer on the top surface of the second initial conductive layer, wherein the first photoresist layer has a first initial mask pattern;

forming an isolation layer on surfaces of the first photoresist layer having the first initial mask pattern;

sequentially etching the isolation layer and the first initial mask pattern with a part of the isolation layer located on side walls of the first initial mask pattern retained, to form an isolation side wall pattern; and etching, through the isolation side wall pattern, the first anti-reflective layer and the first hard mask layer to form the first mask layer having the first mask pattern.

2. The method of claim 1, wherein performing, along the third direction, the second etching treatment on the second etching conductive layers to form the plurality of the first conductive layers independent of each other and the plurality of the second conductive layers, each of which is located on the respective one of the first conductive layers, comprises:

performing, along the third direction, a partial etching treatment on a respective one of the second etching conductive layers to expose a part of the bit line mask layer, so as to form the first conductive layers independent of each other along the first direction and the second conductive layers, each of which is located on the respective one of the first conductive layers.

3. The method of claim 1, further comprising:

after forming the first etching conductive layers independent of each other along the second direction and the second etching conductive layers independent of each other along the second direction and before performing the second etching treatment, filling a storage contact isolation material in a first etching trench between every two adjacent first etching conductive layers and a second etching trench between every two adjacent second etching conductive layers, to form storage contact isolation layers; and etching the storage contact isolation layers to remove a part, on a top surface of the second etching conductive layers, of the storage contact isolation layers.

4. The method of claim 3, further comprising:

forming an air gap located in a center of each of the storage contact isolation layers when filling the first etching trench and the second etching trench with the storage contact isolation material.

5. The method of claim 3, wherein the storage contact isolation material comprises silicon nitride.

6. The method of claim 3, wherein the second etching treatment comprises:

forming a second mask layer with a second mask pattern on the top surface of the second etching conductive layers and a top surface of the storage contact isolation layers; and etching, through the second mask pattern, the second etching conductive layers to remove a part of a respective one of the second etching conductive layers located on the each of bit line mask layers, with remaining parts of the second etching conductive layers forming the second conductive layers.

7. The method of claim 6, wherein the second mask layer comprises a second hard mask layer, a second anti-reflective layer and a second photoresist layer that are stacked in sequence;
- forming the second mask layer with the second mask pattern on the top surface of the second etching conductive layers and the top surface of the storage contact isolation layers, comprises:
- sequentially depositing and forming the second hard mask layer, the second anti-reflective layer and the second photoresist layer on the top surface of the second etching conductive layers and the top surface of the storage contact isolation layers,
- wherein the second photoresist layer has a second mask pattern, and the second mask pattern comprises a plurality of sub patterns disposed in parallel along the first direction,
- wherein an included angle is formed between an extension direction of each sub pattern in a plane parallel to the semiconductor substrate and the first direction, and the included angle is not equal to 90 degrees; and
- sequentially etching, through each of the sub patterns, the second anti-reflective layer and the second hard mask layer to form the second mask layer with the second mask pattern.

* * * * *